United States Patent [19]

Higashiyama et al.

[11] Patent Number: 5,190,913
[45] Date of Patent: Mar. 2, 1993

[54] APPARATUS FOR PRODUCING SUPERCONDUCTING OXIDE FILM

[75] Inventors: Kazutoshi Higashiyama, Hitachi; Takahisa Ushida; Izumi Hirabayashi, both of Nagoya; Shoji Tanaka, Tokyo, all of Japan

[73] Assignees: Hitachi, Ltd., Tokyo; NGK Spark Plug Co., Ltd., Aichi; International Superconductivity Technology Center, Tokyo, all of Japan

[21] Appl. No.: 857,272

[22] Filed: Mar. 25, 1992

[30] Foreign Application Priority Data

Mar. 26, 1991 [JP] Japan .................................. 3-061454

[51] Int. Cl.$^5$ .............................................. C23C 16/00
[52] U.S. Cl. .................................. 505/1; 505/730; 505/734; 118/715; 118/725; 118/688; 118/689; 118/690; 118/708; 118/712; 427/8
[58] Field of Search ............... 118/715, 725, 688, 689, 118/690, 691, 708, 712; 427/8; 505/1, 730, 734

[56] References Cited

U.S. PATENT DOCUMENTS 5,116,811 5/1992 Abe ...................................... 505/734

OTHER PUBLICATIONS

Japanese J. Appl. Phys., vol. 29 (1990), L1072.
Japanese J. Appl. Phys., vol. 29 (1990), 1932.

*Primary Examiner*—Richard Bueker
*Attorney, Agent, or Firm*—Antonelli, Terry, Stout & Kraus

[57] ABSTRACT

An apparatus for producing a superconducting oxide film with stable properties by metal organic chemical vapor deposition, suitable for mass production, is provided with a gas analyzer comprising a differential pressure meter 38 between a raw material gas collector tube 35 provided in a transfer line 8 for leading a raw material gas to a film forming chamber 10 and a bypass line 37, a dilution gas line 49 interlocked with the differential pressure meter 38 and for leading a dilution gas to the raw material gas collector tube 35, a gas separation column 42 branched from the bypass line, a gas detector 31 connected to the gas separation column 42, flow rate controllers 50 for carrier gases 43 and 45 and a thermostat 13 for heating all the lines. Amounts of raw materials gases can be readily measured and controlled and thus superconducting oxide films of stable properties in a constant metal composition ratio can be continuously produced, and thus the present apparatus is suitable for mass production of tape form, superconducting materials.

3 Claims, 4 Drawing Sheets

APPARATUS FOR PRODUCING SUPERCONDUCTING OXIDE FILM

BACKGROUND OF THE INVENTION (1) Field of the Invention

The present invention relates to an apparatus for producing a superconducting oxide film by metal organic chemical vapor deposition (MOCVD) and more particularly to an apparatus having functions to measure and control amounts of raw material gases, suitable for the production of a superconducting oxide film of large area or large length.

(2) Prior Art

A process for forming a superconducting oxide film by MOCVD comprises mixing vaporized source gases in a desired metal composition ratio and supplying the resulting mixture onto a substrate heated at a higher temperature than the decomposition temperatures of the source materials in an oxygen-containing atmosphere under reduced pressure, thereby depositing a desired film onto the substrate.

Generally, source materials for use in the MOCVD process for producing a superconducting oxide film are in a solid state at the ordinary temperature. In the actual formation of the film, solid powders of the source materials are heated at a temperature of about 100° to about 200° C. under reduced pressure and the generated sublimation gas is conveyed with an inert carrier gas into a film formation chamber, in which a substrate is placed. Among the source materials, particularly source materials of alkaline earth metals are thermally unstable and gradually decomposed in evaporator-containers to lose their sublimation properties. Thus, the amounts of raw material gases to be supplied to the film formation chamber change with time. In case of a superconductor of Y system represented, for example, by the following formula [1]:

$$Y_1Ba_2Cu_3O_{7-\delta} \quad [1]$$

the metal composition ratio of $Y:Ba:Cu=1:2:3$ by atom changes and the proper superconducting characteristics is no more obtainable.

To solve the problem, it is possible to directly measure the amounts of raw material gases to be supplied, and feed back the measured values to raw material-heating temperatures or amounts of carrier gas, thereby controlling amounts of raw material gases to be generated. Several procedures have been so far proposed for measuring the amounts of raw material gases [Jpn. J. Appl. Phys., Vol. 29 (1990) L1072 and 1932]. In a procedure using a mass spectrometer as a detector, disclosed in Jpn. J. Appl. Phys., Vol. 29 (1990) L1072, it is necessary to introduce a portion of raw material gases from the raw material gas transfer line or the film formation chamber into the mass spectrometer. The raw material gases generated usually at a heating temperature of 100° to 240° C. will be solidified again at a lower temperature than the heating temperature or decomposed when the heating temperature is too high. Thus, the sampled raw material gases must be led to the analyzing section of the mass spectrometer while keeping the sampled gases hot carefully. However, it is difficult to heat the mass spectrometer itself, and thus it is difficult to obtain satisfactory quantitative results.

In a spectroscopic procedure disclosed in Jpn. J. Appl. Phys., Vol. 29 (1990) 1932, on the other hand, it is possible to directly measure the amounts of raw material gases in the film formation chamber, but it is indispensable for the measurement to form a plasma. In other words, the disclosed spectroscopic procedure is effective only for very limited processes based on the so called "plasma-assisted CVD". No quantitative correlation between the light intensities from the individual raw material gases and their concentrations are disclosed therein.

SUMMARY OF THE INVENTION

An object of the present invention is to provide an apparatus for producing a superconducting oxide film with a control means capable of quantitatively measuring raw material gases in a simple manner and controlling raw material gas supplies on the basis of the quantitative data of the raw material gases.

The present invention provides an apparatus for producing a superconducting oxide film by metal organic chemical vapor phase deposition (MOCVD), which comprises a raw material gas generator provided with a heater and for holding a raw material organic metal, a film formation chamber provided with a heated substrate therein, a raw material gas transfer line provided between the raw material gas generator and the film formation chamber and kept at a given temperature, a vacuum pump for evacuating the film formation chamber to reduced pressure, and a raw material gas analyzer comprising a raw material gas collector tube provided in the raw material gas transfer line, a carrier line provided as a bypass to the raw material gas collector tube, a differential pressure meter provided between the raw material gas collector tube and the carrier line, a dilution gas line interlocked with the differential pressure meter and for leading a dilution gas to the raw material gas collector tube, a vacuum pump for evacuating the raw material gas collector tube, a gas separation column branched from the carrier line, a gas detector connected to the gas separation column, a flow rate controller for supplying a carrier gas to the carrier line and flow path switch valves provided at branches of all the lines, and heating means for heating all the lines.

The present invention further provides an apparatus for producing a superconducting oxide film, as mentioned above, wherein the gas detector is a hydrogen flame ionization detector or a thermal conductivity detector.

The present invention still furthermore provides an apparatus for producing a superconducting oxide film, as mentioned above, wherein a control means for controlling the flow rate controller for supplying the carrier gas or the heater of the raw material gas generator by a control signal proportional to a difference between an output value of the gas detector and a set value is further provided.

In the present invention, organometallic compounds such as organometallic complexes are used as raw material organic metals, where the metal species and species of organic parts are selected in view of a desired superconducting oxide film. Shape of the raw material gas generator for holding the raw material organic metal is selected in view of characteristics, etc. of the raw materials and number of the raw material gas generator is selected in view of the kind of a desired superconducting oxide film.

In the raw material gas analyzer of the apparatus for producing a superconducting oxide film, the raw material gas collector tube provided in parallel to the raw material gas transfer line is evacuated to the vacuumness of the raw material gas transfer line before the collection of the raw material gas for analysis, and thus there is no fluctuation in the pressure during the gas collection and an influence on the amount of the raw material gas to be transferred to the film formation chamber can be substantially disregarded.

The gas detector for use in the raw material gas analyzer can be used irrespective of operating pressure at the analysis, i.e. under any pressure such as subatmospheric, atmospheric or superatmospheric pressure, if the gas detector can be used at the heating temperature of a raw material to be used. For example, the hydrogen flame ionization detector is suitable for analysis under atmospheric or superatmospheric pressure of the raw material gas collected under subatmospheric pressure. The thermal conductivity detector can be used even under subatmospheric pressure by suppressing fluctuation in the pressure during the analysis. The differential pressure meter and the dilution gas line are operated so as to set the pressure of the raw material gas collector tube in accordance to the pressure of the gas detector.

A plurality of the raw material gas analyzer can be provided each in individual raw material gas transfer lines when a plurality of raw material gas are used, or one raw material gas analyzer may be used in the transfer line after mixing of the individual raw material gases, or a combination of these arrangements of the raw material gas analyzers can be used. A plurality of raw material gases may be collected one after another and analyzed in one gas detector.

When a gas mixture composed of a plurality of raw material gases is analyzed or when one raw material gas containing other gas than the carrier gas is analyzed, the gas separation column provided before the gas detector fractionates these gases from time to time and the fractionated gases are successively led to the gas detector. The gas separation column for use in the present invention is a column tube of a material selected from various materials, filled or coated with an adsorbent, etc. Selection of adsorbent, etc. and tube material can be made in view of the species of gases to be separated and separating conditions.

Flow path switch valves to be provided in the raw material gas analyzer can have any structure, for example, an on-off valve type, so long as they can be used at heating temperatures of the raw materials to be used.

According to the present invention, a superconducting oxide film in a constant metal composition ratio with stable properties can be produced continuously for a long time, because the amounts of raw material gases to be supplied, which have been difficult to measure so far, can be readily measured and controlled to constant values.

PREFERRED EMBODIMENTS OF THE INVENTION

The present invention will be explained in detail below, referring to Examples.

(1) Outline of the apparatus used

Figure 1:
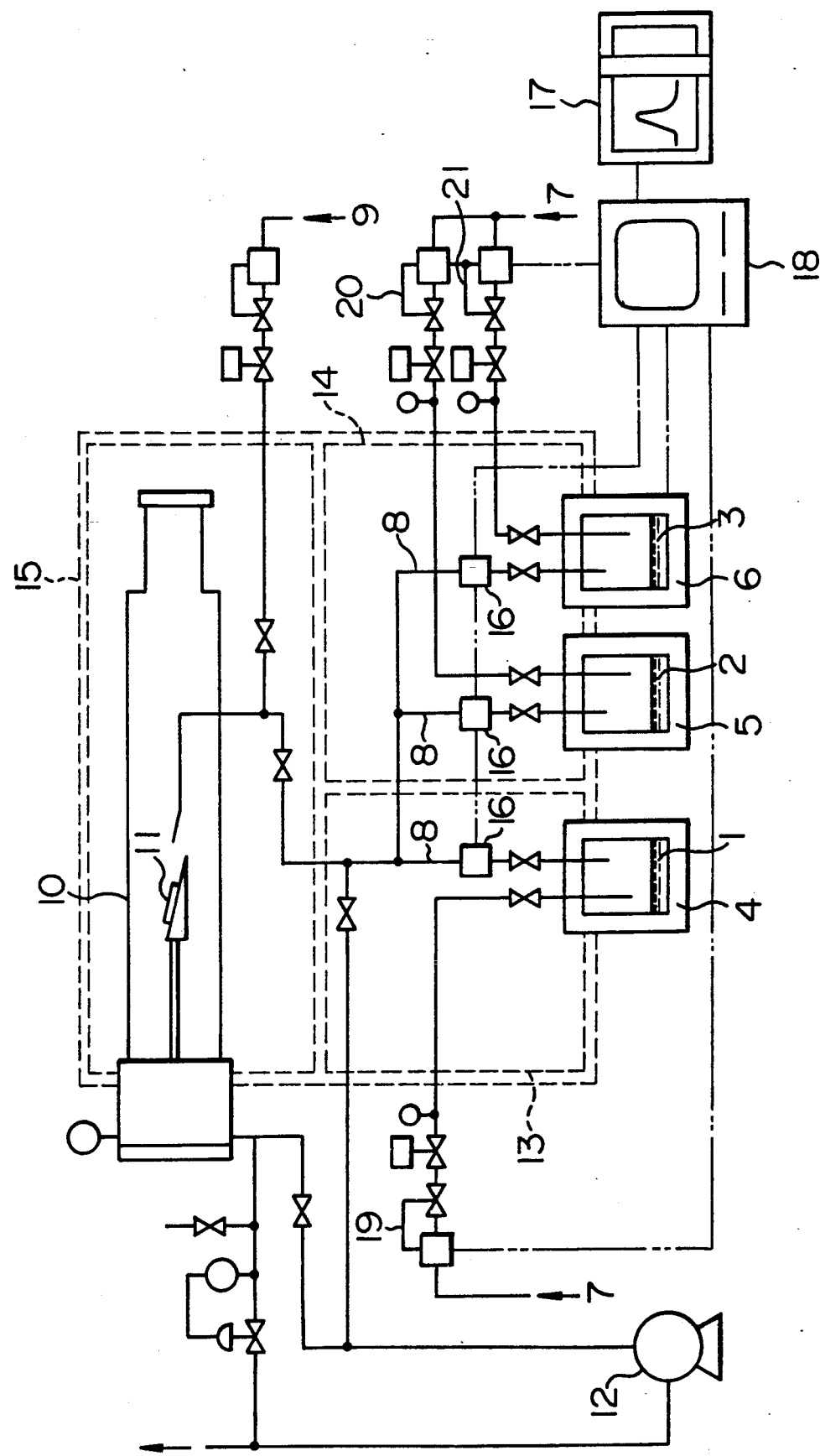
FIG. 1 is a schematic view of one embodiment of the present apparatus for producing a superconducting oxide film.

One example of the present apparatus for producing a superconducting thin film is shown in FIG. 1.

Raw material containers (raw material gas generators) 1, 2 and 3 for holding individual organometallic complex raw materials are heated by raw material heaters 4, 5 and 6 and kept at the respective predetermined temperatures. Raw materials are vaporized by heating and the resulting raw material gases are mixed each with a carrier gas (N$_2$) introduced from a carrier gas inlet 7 through individual raw material gas transfer lines 8 and then mixed with a predetermined amount of oxygen from an oxygen gas inlet 9 on the way to a film formation chamber 10. The mixed gas is supplied onto a substrate 11 in the film forming chamber 10. The system from the film forming chamber 10 to the raw material container 1, 2 and 3 are brought to a subatmospheric pressure by an evacuation vacuum pump 12. The raw material transfer lines 8 and the film formation chamber 10 are heated and kept at respective predetermined temperatures in thermostat tanks 13, 14 and 15.

Raw material gas analyzers 16 are provided in the respective raw material gas transfer lines 8, and signals from the raw material gas analyzers 16 are recorded on a recorder 17 and further processed by a computer 18. In order to keep the amounts of the individual raw material gases to be supplied constant, the raw material heaters 4, 5 and 6 and carrier gas flow rate controllers 19, 20 and 21 are controlled by the computer 18 according to signals from the raw material gas analyzers 16.

Figure 2:
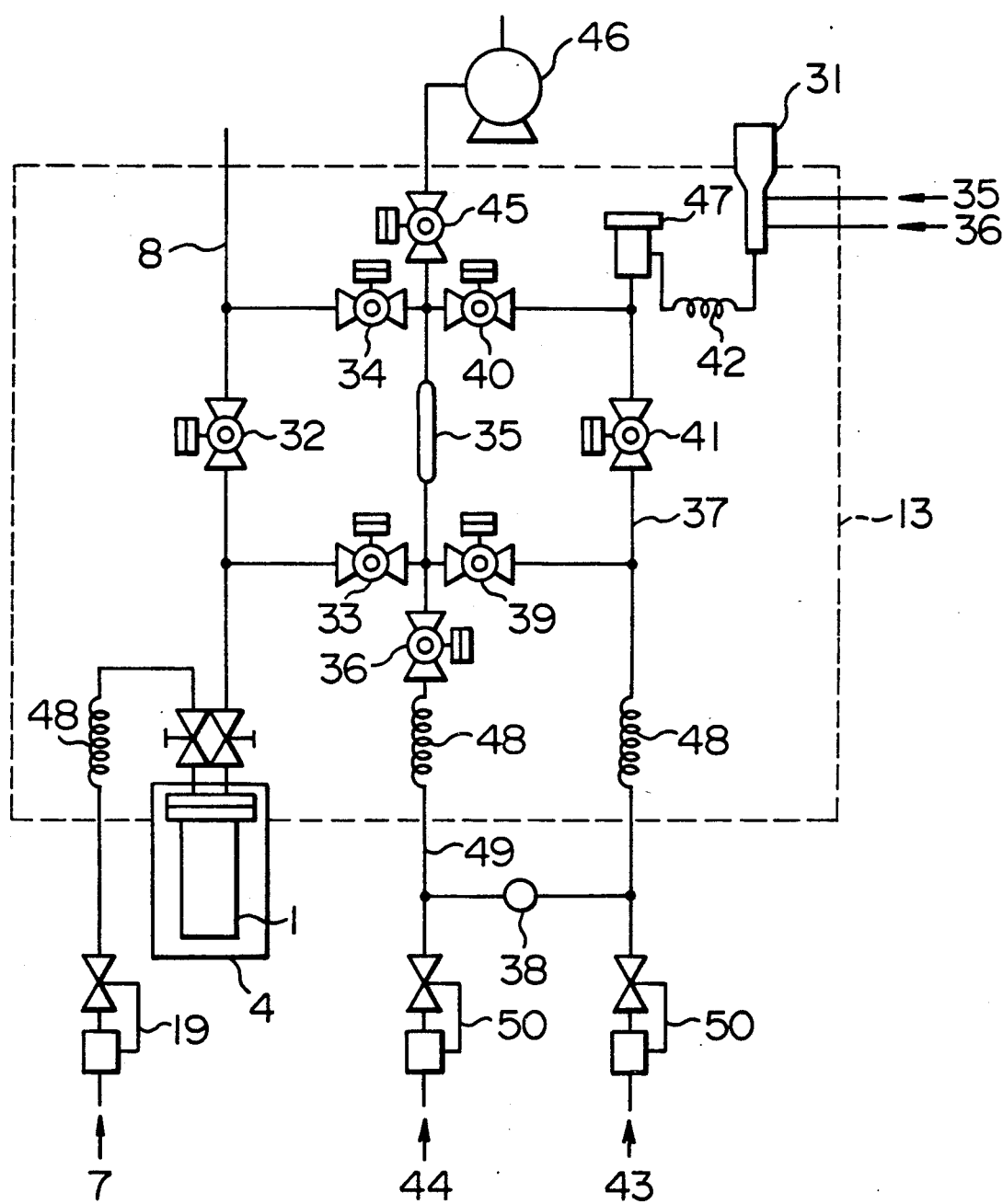
FIG. 2 is a structural view of a raw material gas analyzer provided in the apparatus for producing a superconducting oxide film according to the embodiment of the present invention.

Structure of the raw material gas analyzer 16 is shown in FIG. 2.

A gas detector 31 is a hydrogen flame ionization detector (FID). The raw material gas passing through the raw material gas transfer line 8 flows through a raw material gas collector tube 35 by opening valves 33 and 34 and closing a valve 32. After a predetermined time, the valve 32 is opened and the valves 33 and 34 are closed, whereby a gas mixture composed of the raw material gas and a transfer carrier gas (N$_2$) is collected in the raw material gas collector tube 35.

On the other hand, predetermined amounts of hydrogen and air are supplied to the gas detector (FID) 31 from lines 35 and 36, respectively, to form a hydrogen flame. A carrier gas (N$_2$) 43 for transferring the collected raw material gas to FID 31 initially flows through a flow rate meter 50, a spiral tube 48, a bypass line (carrier line) 37 directly to FID 31. Since the raw material gas collector tube 35 is evacuated to a subatmospheric pressure by a vacuum pump 46 in advance, a N$_2$ gas 44 is supplied through a flow rate meter 50, a spiral tube 48 and a dilution line 49 thereto by opening a valve 36. When a differential pressure meter 38 indicates that the pressure in the dilution line 49 to the raw material gas collector tube 35 is equal to the pressure in the bypass line 37, the valve 36 is closed. Then, valves 39 and 40 are opened and the valve 41 is closed, whereby the raw material gas collected in the raw material gas tube 35 is passed through an evaporator 47 and a gas separation column 42 to FID 31 by the $N_2$ carrier gas 43.

Figure 3:
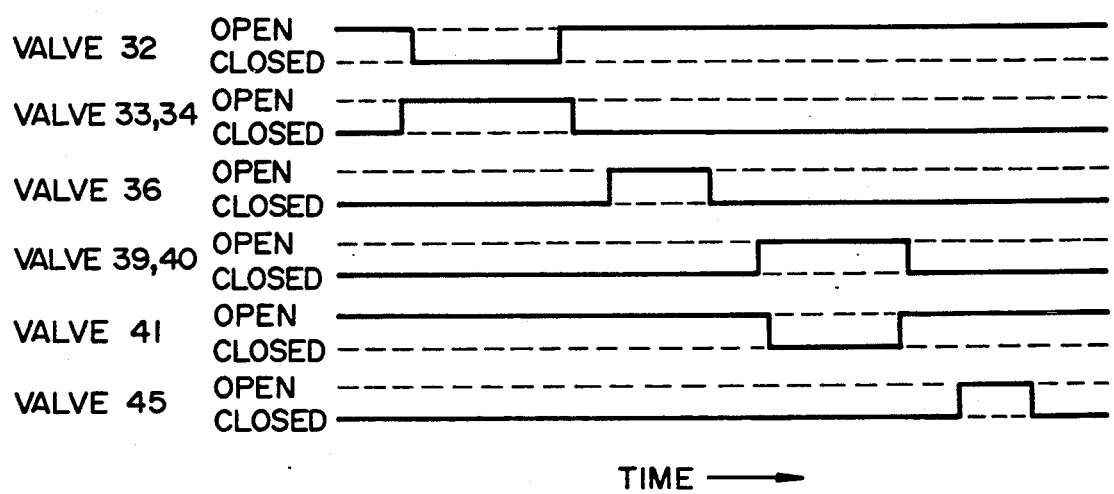
FIG. 3 is a diagram showing operating sequences of valves as constituents of the raw material gas analyzer according to the present invention.

The individual valves used are of pneumatic operation type and controlled according to the sequence shown in FIG. 3.

(2) Raw material gas measurement test

Metal β-diketone complexes of $Y(thd)_3$, $Ba(thd)_2$ and $Cu(thd)_2$ were used as raw materials, where "thd" represents 2,2,6,6-tetramethyl-3,5-heptadione. Heating temperature of the raw materials were 120° C., 235° C. and 120° C., respectively, in this order. As to $Cu(thd)_2$, measurement was also carried out at varied heating temperatures ranging from 100° to 120° C.

Flow rate of the individual carrier gas ($N_2$) was 10 sccm and the pressure in the raw material containers 1, 2 and 3 for holding the individual raw materials were about 15 Torr. Flow rate of the carrier gas ($N_2$) to be supplied to FID 31 was 20 sccm.

Temperatures of thermostat tanks 13, 14 and 15 encasing the individual raw material gas transfer lines 8 and raw material gas analyzers 16 were 140° for $Y(thd)_2$ and $Cu(thd)_2$ and 250° C. for $Ba(thd)$.

Gas separation column 42 for $Y(thd)_3$ and $Cu(thd)_2$ was a polyethylene fluoride tube, 3 mm in inner diameter and 60 cm long, filled with glass beads treated with 0.5% fluorosilicone grease/silane, 80–100 mesh, and that for $Ba(thd)_2$ was a stainless steel tube, 3 mm in diameter and 1 m long, filled with glass beads treated with 0.1% silicone methyl gum 1 silane, 80–100 mesh.

By controlling the individual valves to open or close in accordance with the sequence shown in FIG. 3 under the afore-mentioned conditions, FID signals corresponding to the amounts of raw material gases collected in the raw material gas collector tube 35 could be obtained.

(3) FID quantitative test

In order to determine amounts of raw material gases from the FID output values, it is necessary to predetermine calibration curves.

Diethyl ether solutions at given concentrations each of $Y(thd)_3$, $Ba(thd)_2$ and $Cu(thd)_2$ were prepared, and definite amounts of the solutions were injected into the evaporator 47 in FIG. 2 by a microsylinge, and the vaporized gas was led through the gas separation column 42 to FID 31 by the carrier gas ($N_2$). By changing the amounts of the solutions, correlation thereof to the FID outputs were obtained to prepare calibration curves for the respective gases. The same analytical conditions as in the foregoing raw material gas measurement test was used.

EXAMPLE 1

Figure 4:
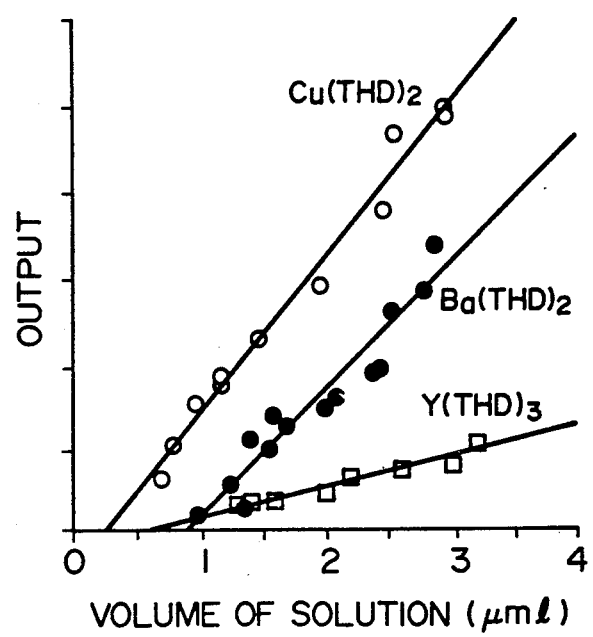
FIG. 4 is a diagram showing correlations (calibration curves) between the FID output and amounts of raw materials.

Carlibration curves of the respective raw materials obtained by the foregoing FID quantitative test are shown in FIG. 4. Correlations between the amounts of supplied raw materials and FID outputs were linear and thus these two factors were in a proportional relation, where the FID outputs were shown by their integral values (peak area values).

EXAMPLE 2

Figure 5:
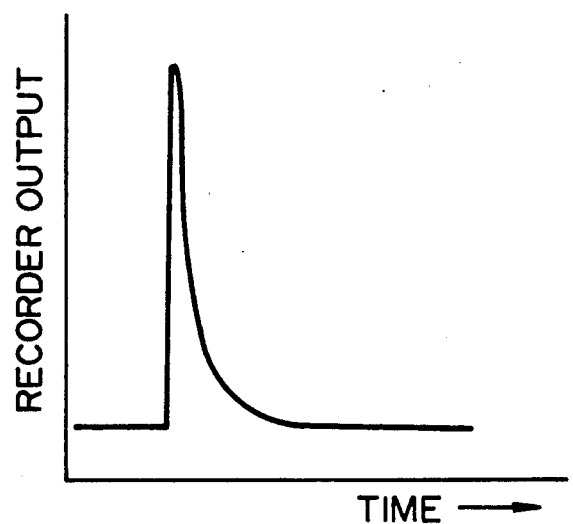
FIG. 5 is a diagram showing an example of analyzing a Cu(thd)$_2$ raw material gas.

Analytical example of $Cu(thd)_2$ by the raw material gas measurement test is shown in FIG. 5, where time is plotted on the axis of abscissa and the recorder output on the axis of ordinate, peaks of similar shape were obtained for $Y(thd)_3$ and $Ba(thd)_2$.

EXAMPLE 3

Figure 6:
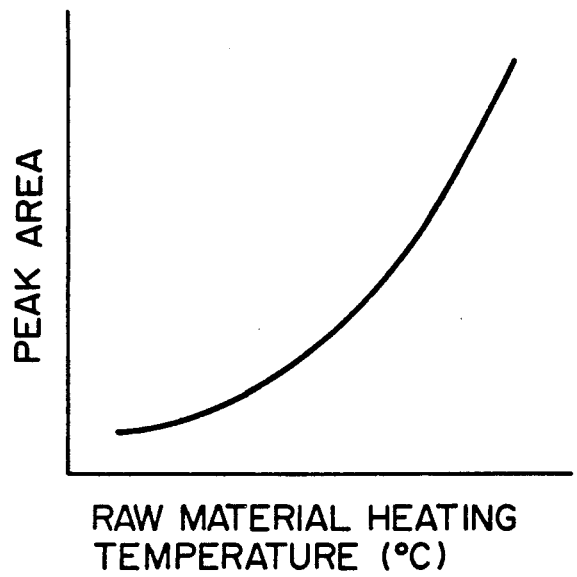
FIG. 6 is a diagram showing a correlation between the heating temperature of Cu(thd)$_2$ raw material and the FID output.

Changes in the output peak area value of the detector when the heating temperature of $Cu(thd)_2$ was changed in a range of 100° to 120° C. are shown in FIG. 6. With increasing heating temperature, the amount of the raw material gas was increased, and correspondingly the peak area value was increased.

The present invention is not limited only is the foregoing embodiments, but can be also applied, for example, as an apparatus for forming a molecular beam epitaxial film from organometal raw materials.

In the present apparatus for forming a superconducting oxide film, amounts of raw material gas to be supplied, which have been difficult to measure, can be readily measured and can be controlled to constant values in spite of fluctuations in the amounts of generated gases due to the nature of the raw materials. Thus, it is possible to continuously produce superconducting oxide films with stable properties in a constant metal composition ratio for a long time, and the present invention is very useful for mass production of superconducting devices such as Josephson junctions, etc. or tapeform superconducting materials.

What is claimed is:

1. An apparatus for producing a superconducting oxide film by metal organic chemical vapor deposition, which comprises a raw material gas generator provided with a heater and for holding a raw material organic metal, a film formation chamber provided with a heated substrate therein, a raw material gas transfer line provided between the raw material gas generator and the film formation chamber and kept at a given temperature, a vacuum pump for evacuating the film formation chamber to reduced pressure, and a raw material gas analyzer comprising a raw material gas collector tube provided in the raw material gas transfer line, a carrier line provided as a bypass to the raw material gas collector tube, a differential pressure meter provided between the raw material gas collector tube and the carrier line, a dilution gas line interlocked with the differential pressure meter and for leading a dilution gas to the raw material gas collector tube, a vacuum pump for evacuating the raw material gas collector tube, a gas separation column branched from the carrier line, a gas detector connected to the gas separation column, a flow rate controller for supplying a carrier gas to the carrier line and flow path switch valves provided at branches of all the lines, and heating means for heating all the lines.

2. An apparatus according to claim 1, wherein the gas detector is a hydrogen flame ionization detector or a thermal conductivity detector.

3. An apparatus according to claim 1 or 2, wherein a control means for controlling the flow rate controller for supplying the carrier gas or the heater of the raw material gas generator by a control signal proportional to a difference between an output value of the gas detector and a set value is further provided.

* * * * *